United States Patent
Sugita et al.

(10) Patent No.: US 10,290,490 B2
(45) Date of Patent: May 14, 2019

(54) DUST COLLECTING APPARATUS, SUBSTRATE PROCESSING SYSTEM, AND METHOD OF MANUFACTURING SEMICONDUCTOR DEVICE

(71) Applicant: TOSHIBA MEMORY CORPORATION, Minato-ku (JP)

(72) Inventors: Tomohiko Sugita, Yokkaichi (JP); Hiroyasu Iimori, Mie (JP); Yoshihiro Ogawa, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 208 days.

(21) Appl. No.: 15/239,243

(22) Filed: Aug. 17, 2016

(65) Prior Publication Data

US 2017/0250069 A1 Aug. 31, 2017

(30) Foreign Application Priority Data

Feb. 25, 2016 (JP) .................................. 2016-034316

(51) Int. Cl.
*B01D 43/00* (2006.01)
*H01L 21/02* (2006.01)
(Continued)

(52) U.S. Cl.
CPC ...... *H01L 21/02057* (2013.01); *B01D 21/283* (2013.01); *B01D 43/00* (2013.01);
(Continued)

(58) Field of Classification Search
CPC ......... H01L 21/02057; H01L 21/67051; H01L 21/68764; H01L 21/67017; B01D 43/00;
(Continued)

(56) References Cited

U.S. PATENT DOCUMENTS 2,215,484 A * 9/1940 St Clair ............... B01D 49/006
95/29
5,831,166 A 11/1998 Kozuka et al.
(Continued)

FOREIGN PATENT DOCUMENTS

JP 10-82723 3/1998
JP 11-104979 4/1999
(Continued)

*Primary Examiner* — Walter D. Griffin
*Assistant Examiner* — Cameron J Allen
(74) *Attorney, Agent, or Firm* — Oblon, McClelland, Maier & Neustadt, L.L.P.

(57) ABSTRACT

In one embodiment, a dust collecting apparatus includes a container configured to contain a fluid that includes particles to be collected. The apparatus further includes one or more sound sources configured to generate, in the container, a standing sound wave including at least one node to trap the particles in a vicinity of the node. The one or more sound sources are configured to generate the standing sound wave so that the node does not contact a wall face of the container or contacts a predetermined portion of the wall face of the container. The predetermined portion is formed of a member that prevents the particles from leaving from the node located in a vicinity of the predetermined portion.

17 Claims, 13 Drawing Sheets

(51) Int. Cl.
   *B01D 49/00*    (2006.01)
   *B08B 3/12*     (2006.01)
   *H01L 21/687*   (2006.01)
   *B01D 21/28*    (2006.01)
   *B01D 51/08*    (2006.01)
   *H01L 21/67*    (2006.01)

(52) U.S. Cl.
   CPC ........... *B01D 49/006* (2013.01); *B01D 51/08* (2013.01); *B08B 3/12* (2013.01); *H01L 21/67017* (2013.01); *H01L 21/68764* (2013.01); *H01L 21/67051* (2013.01)

(58) Field of Classification Search
   CPC .... B01D 49/006; B01D 21/283; B01D 51/08; B08B 3/12; B03C 3/38; B03C 3/41
   See application file for complete search history.

(56) References Cited

U.S. PATENT DOCUMENTS

| | | | |
|---|---|---|---|
| 7,674,630 B2 | 3/2010 | Siversson | |
| 7,837,040 B2 | 11/2010 | Ward et al. | |
| 8,273,302 B2 | 9/2012 | Takahashi et al. | |
| 8,865,003 B2 | 10/2014 | Yang | |
| 8,991,614 B2 | 3/2015 | Rose et al. | |
| 9,134,271 B2 | 9/2015 | Ward et al. | |
| 2006/0163166 A1 | 7/2006 | Hawkes et al. | |
| 2012/0325747 A1* | 12/2012 | Rietman | B01D 61/00 210/651 |

FOREIGN PATENT DOCUMENTS

| | | | |
|---|---|---|---|
| JP | 11-197491 | 7/1999 | |
| JP | 2001-157999 | 6/2001 | |
| JP | 2004-24959 A | 1/2004 | |
| JP | 2004-181347 | 7/2004 | |
| JP | 2005-342598 A | 12/2005 | |
| JP | 2006-501994 | 1/2006 | |
| JP | 4695144 | 6/2011 | |
| JP | 2012-503776 | 2/2012 | |
| JP | 5018879 | 9/2012 | |
| JP | 2012-217876 | 11/2012 | |
| JP | 2013-533107 A | 8/2013 | |
| JP | 2014-151260 | 8/2014 | |
| JP | 2017140588 A * | 8/2017 | ............ B01D 51/02 |
| WO | WO 2012/017976 A1 | 2/2012 | |

* cited by examiner

DUST COLLECTING APPARATUS, SUBSTRATE PROCESSING SYSTEM, AND METHOD OF MANUFACTURING SEMICONDUCTOR DEVICE

CROSS REFERENCE TO RELATED APPLICATION

This application is based upon and claims the benefit of priority from the prior Japanese Patent Application No. 2016-34316, filed on Feb. 25, 2016, the entire contents of which are incorporated herein by reference.

FIELD

Embodiments described herein relate to a dust collecting apparatus, a substrate processing system, and a method of manufacturing a semiconductor device.

BACKGROUND

When a wafer is processed with a fluid such as a liquid or a gas, it is often necessary to eliminate particles in the fluid. In general, the particles can be eliminated by passing the fluid through a filter made of a porous member or the like. However, this case causes problems that the filter may be clogged, pressure loss of the fluid is generated by the filter, and costs and contamination for replacing the filter are concerned.

DETAILED DESCRIPTION

Embodiments will now be explained with reference to the accompanying drawings.

In one embodiment, a dust collecting apparatus includes a container configured to contain a fluid that includes particles to be collected. The apparatus further includes one or more sound sources configured to generate, in the container, a standing sound wave including at least one node to trap the particles in a vicinity of the node. The one or more sound sources are configured to generate the standing sound wave so that the node does not contact a wall face of the container or contacts a predetermined portion of the wall face of the container. The predetermined portion is formed of a member that prevents the particles from leaving from the node located in a vicinity of the predetermined portion.

First Embodiment

Figure 1:
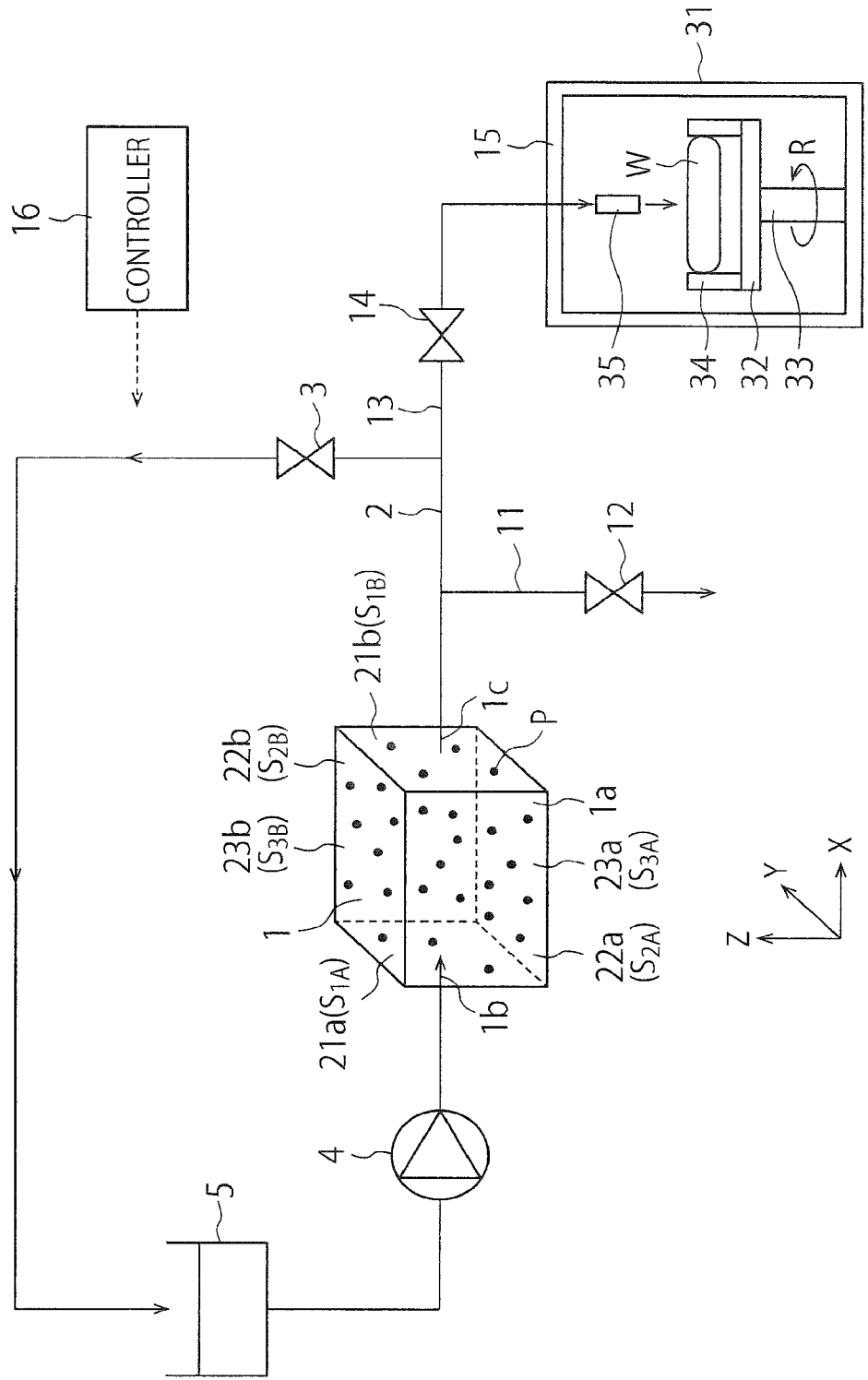
FIG. 1 is a schematic view showing a configuration of a substrate processing system of a first embodiment.

FIG. 1 is a schematic view showing a configuration of a substrate processing system of a first embodiment.

The substrate processing system of FIG. 1 includes a dust collecting apparatus 1, a circulating channel 2, a circulating channel valve 3, a pump 4, a tank 5, a first channel 11, a first channel valve 12, a second channel 13, a second channel valve 14, a substrate processing apparatus 15 and a controller 16.

The dust collecting apparatus 1 includes a container 1a configured to contain a fluid that includes particles P to be collected, an introduction port 1b configured to introduce the fluid into the container 1a, and a discharge port 1c configured to discharge the fluid from the container 1a. Examples of the fluid include a liquid such as water or a chemical solution, and a gas such as air, a carbon dioxide gas, an ammonia gas or a silane gas.

The circulating channel 2 is connected to the introduction port 1b and the discharge port 1c. The circulating channel valve 3, the pump 4 and the tank 5 are provided on the circulating channel 2. The circulation and a circulating amount of the fluid in the circulating channel 2 are controlled by opening or closing the circulating channel valve 3 and adjusting an opening degree of the circulating valve 3. The fluid in the circulating channel 2 is fed by the pump 4, stored in the tank 5, and then passes through the container 1a from the introduction port 1b to the discharge port 1c. The particles P in the fluid are eliminated in the container 1a.

FIG. 1 shows the X-direction, the Y-direction and the Z-direction that are perpendicular to one another. In the present embodiment, the X-direction and the Y-direction are parallel to an installation plane of the dust collecting apparatus 1, and the Z-direction is perpendicular to the installation plane of the dust collecting apparatus 1. In the present specification, the +Z-direction is treated as an upward direction, and the −Z-direction is treated as a downward direction. The −Z-direction of the present embodiment may coincide with the direction of gravitational force, or may not coincide with the direction of gravitational force.

Figure 2:
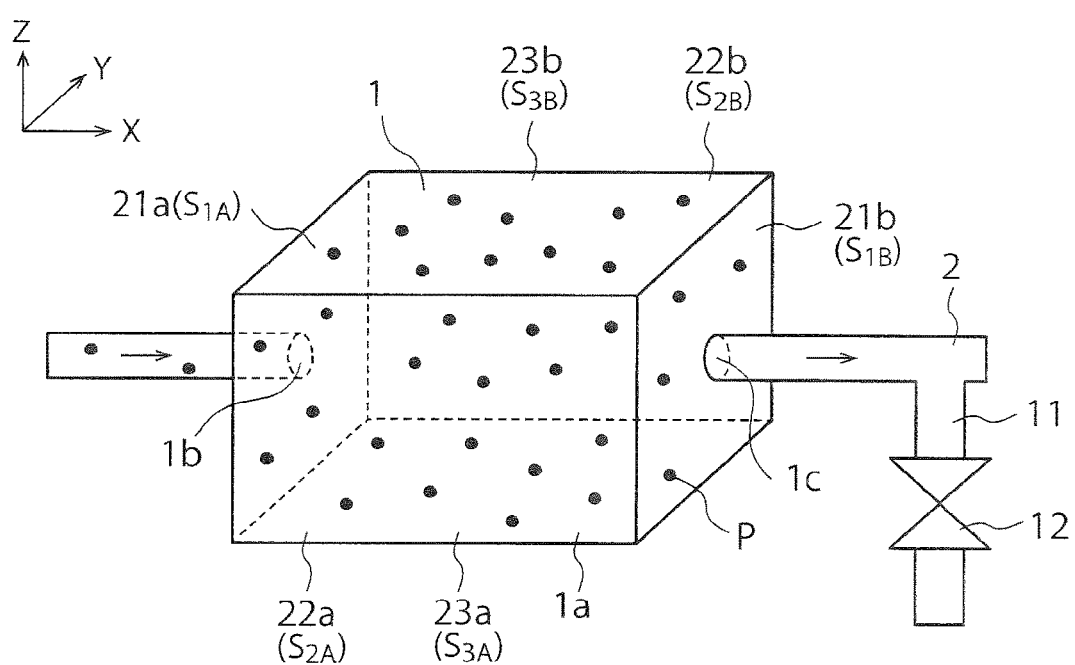
FIG. 2 is a perspective view showing a structure of a dust collecting apparatus in the first embodiment.

The container 1a of the present embodiment includes an inner wall face having a shape of a rectangular parallelepiped. Specifically, the container 1a of the present embodiment has a pair of first wall faces $S_{1A}$ and $S_{1B}$ that are perpendicular to the X-direction and are opposed to each other, a pair of second wall faces $S_{2A}$ and $S_{2B}$ that are perpendicular to the Y-direction and are opposed to each other, and a pair of third wall faces $S_{3A}$ and $S_{3B}$ that are perpendicular to the Z-direction and are opposed to each other. The introduction port 1b is provided on one first wall face $S_{1A}$, and the discharge port 1c is provided on the other first wall face $S_{1B}$ (refer to FIG. 2). FIG. 2 is a perspective view showing a structure of the dust collecting apparatus 1 in the first embodiment.

With reference to FIG. 1 again, description of the substrate processing system will be continued.

The dust collecting apparatus 1 includes a first sound source 21a provided in a vicinity of one first wall face $S_{1A}$, and a first reflector 21b that forms the other first wall face $S_{1B}$. The dust collecting apparatus 1 further includes a second sound source 22a provided in a vicinity of one second wall face $S_{2A}$, and a second reflector 22b that forms the other second wall face $S_{2B}$. The dust collecting apparatus 1 further includes a third sound source 23a provided in a vicinity of one third wall face $S_{3A}$, and a third reflector 23b that forms the other third wall face $S_{3B}$. The sound sources 21a, 22a and 23a are an example of one or more sound sources.

The sound sources 21a, 22a and 23a generate sound waves in the container 1a. Examples of the sound sources 21a, 22a and 23a include piezoelectric devices. The reflectors 21b, 22b and 23b reflect the sound waves from the sound sources 21a, 22a and 23a. It is desirable that each of the reflectors 21b, 22b and 23b is formed of a material having high reflectivity of sound waves. The sound waves from the sound sources 21a, 22a and 23a propagate through the fluid in the container 1a and are reflected by the reflectors 21b, 22b and 23b.

The dust collecting apparatus 1 can generate, in the container 1a, a standing sound wave including one or more nodes and one or more antinodes by these sound sources and reflectors. As a result, force heading for the nodes of the standing sound wave acts on the particles P, and thereby the particles P are trapped in the vicinity of the nodes of the standing sound wave. The number of nodes in the standing sound wave may be any number.

No matter how the requirements of the sound waves are set as long as the particles P can be trapped. For example, the frequency of the sound waves is set to 1 MHz to 100 MHz, the wavelength of the sound waves is set to 10 μm to 1000 μm, and the amplitude of the sound waves is set to 0.001 MPa to 0.1 MPa. It is desirable that the requirements of the sound waves are set in consideration of a flow rate and a viscosity of the fluid, and particle diameters of the particles P. The frequency of the sound waves may be the frequency within an audible range or may be the frequency out of the audible range. The sound waves of the present embodiment have the frequency out of the audible range. If the fluid has corrosivity, surfaces of components and members in the container 1a may be covered with protective films.

The first reflector 21b may be replaced with a sound source. In other words, the dust collecting apparatus 1 may include the sound source in the vicinity of only one of the first wall faces $S_{1A}$ and $S_{1B}$, or may include the sound sources in the vicinity of both of the first wall faces $S_{1A}$ and $S_{1B}$. Similarly, the second reflector 22b may be replaced with the sound source, and the third reflector 23b may be replaced with the sound source.

Moreover, the sound sources 21a, 22a and 23a may be exposed to the fluid in the container 1a, or may not be exposed to the fluid in the container 1a. In the former case, the surfaces of the sound sources 21a, 22a and 23a constitute portions of the inner wall face of the container 1a. This is true for the sound sources that replace the reflectors 21b, 22b and 23b.

The first channel 11 is connected to the circulating channel 2, and the first channel valve 12 is provided on the first channel 11. The circulation and a circulating amount of the fluid in the first channel 11 are controlled by opening or closing the first channel valve 12 and adjusting an opening degree of the first channel valve 12. The second channel 13 is connected to the circulating channel 2, and the second channel valve 14 is provided on the second channel 13. The circulation and a circulating amount of the fluid in the second channel 13 are controlled by opening or closing the second channel valve 14 and adjusting an opening degree of the second channel valve 14. The second channel 13 is connected to the substrate processing apparatus 15.

The dust collecting apparatus 1 makes it possible, by discharging the fluid while trapping the particles P in the vicinity of the nodes, to discharge the fluid in which the particles P are reduced. In this case, the concentration of the particles P in the fluid discharged from the discharge port 1c becomes lower than the concentration of the particles P in the fluid introduced to the introduction port 1b. When the fluid is discharged from the dust collecting apparatus 1, the substrate processing system of the present embodiment closes the first channel valve 12 and opens the second channel valve 14. As a result, the fluid is supplied to the substrate processing apparatus 15 via the second channel 13. The second channel 13 is used to supply the fluid to the substrate processing apparatus 15.

The dust collecting apparatus 1 further makes it possible, by discharging the fluid together with the particles P trapped in the vicinity of the nodes, to discharge the fluid in which the particles P are concentrated. In this case, the concentration of the particles P in the fluid discharged from the discharge port 1c becomes higher than the concentration of the particles P in the fluid introduced to the introduction port 1b. When the fluid is discharged from the dust collecting apparatus 1, the substrate processing system of the present embodiment opens the first channel valve 12 and closes the second channel valve 14. As a result, the fluid is supplied to the first channel 11. The first channel 11 is used to discard the fluid without supplying the fluid to the substrate processing apparatus 15.

The substrate processing apparatus 15 includes a container 31, a holder 32, a rotating shaft 33, chuck pins 34 and a nozzle 35. The container 31 is configured to contain a wafer (substrate) to be processed. The holder 32 holds the wafer W in the container 31 by the chuck pins 34. The rotating shaft 33 rotates the wafer W by rotating the holder 32 as the arrow R. The nozzle 35 ejects the fluid from the second channel 13 to the wafer W.

The substrate processing apparatus 15 processes the wafer W with the fluid from the second channel 13. For example, the substrate processing apparatus 15 can clean the wafer W by supplying a cleaning liquid as the fluid while rotating the wafer W. Moreover, the substrate processing apparatus 15 can rinse the wafer W by supplying a rinse liquid as the fluid while rotating the wafer W. According to the present embodiment, it is possible to clean or rinse the wafer W by the fluid from which the particles P have been eliminated. Furthermore, the substrate processing apparatus 15 may form a coating film on the wafer W by supplying a coating liquid as the fluid while rotating the wafer W.

The controller 16 controls operations of the substrate processing system. For example, the controller 16 controls operations of the dust collecting apparatus 1, the pump 4 and the substrate processing apparatus 15, and the opening, closing and opening degree of the circulating channel valve 3, the first channel valve 12 and the second channel valve 14.

Figure 3A:
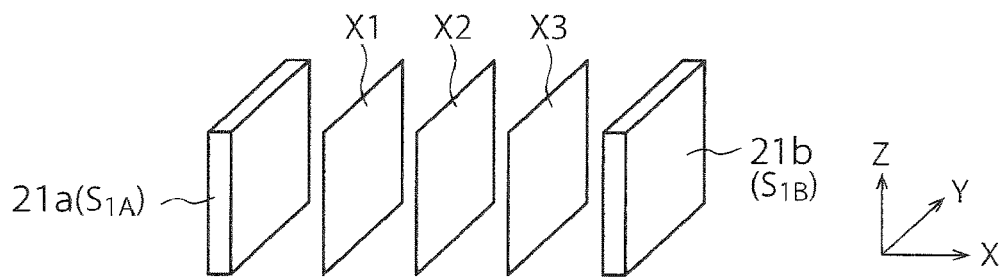
FIGS. 3A to 3C are perspective views for illustrating action of sound sources and reflectors of the first embodiment.
Figure 3B:
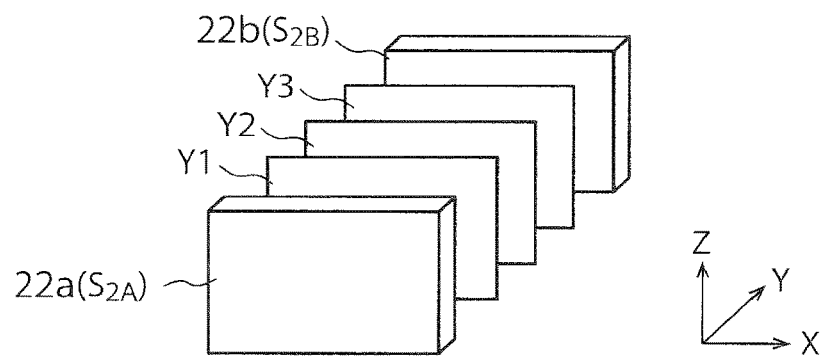
Figure 3C:
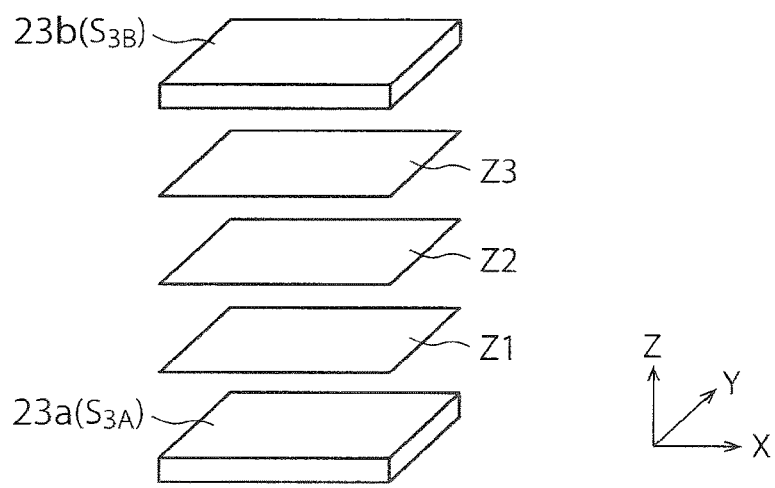

FIGS. 3A to 3C are perspective views for illustrating action of the sound sources and the reflectors of the first embodiment.

FIG. 3A shows the action of the first sound source 21*a* and the first reflector 21*b*. The dust collecting apparatus 1 can generate a standing sound wave having nodes X1, X2 and X3 by generating a sound wave from the first sound source 21*a* and reflecting the sound wave by the first reflector 21*b*. The shapes of the nodes X1, X2 and X3 are planes perpendicular to the X-direction. The number of nodes in this standing sound wave may be other than three.

FIG. 3B shows the action of the second sound source 22*a* and the second reflector 22*b*. The dust collecting apparatus 1 can generate a standing sound wave having nodes Y1, Y2 and Y3 by generating a sound wave from the second sound source 22*a* and reflecting the sound wave by the second reflector 22*b*. The shapes of the nodes Y1, Y2 and Y3 are planes perpendicular to the Y-direction. The number of nodes in this standing sound wave may be other than three.

FIG. 3C shows the action of the third sound source 23*a* and the third reflector 23*b*. The dust collecting apparatus 1 can generate a standing sound wave having nodes Z1, Z2 and Z3 by generating a sound wave from the third sound source 23*a* and reflecting the sound wave by the third reflector 23*b*. The shapes of the nodes Z1, Z2 and Z3 are planes perpendicular to the Z-direction. The number of nodes in this standing sound wave may be other than three.

Figure 4:
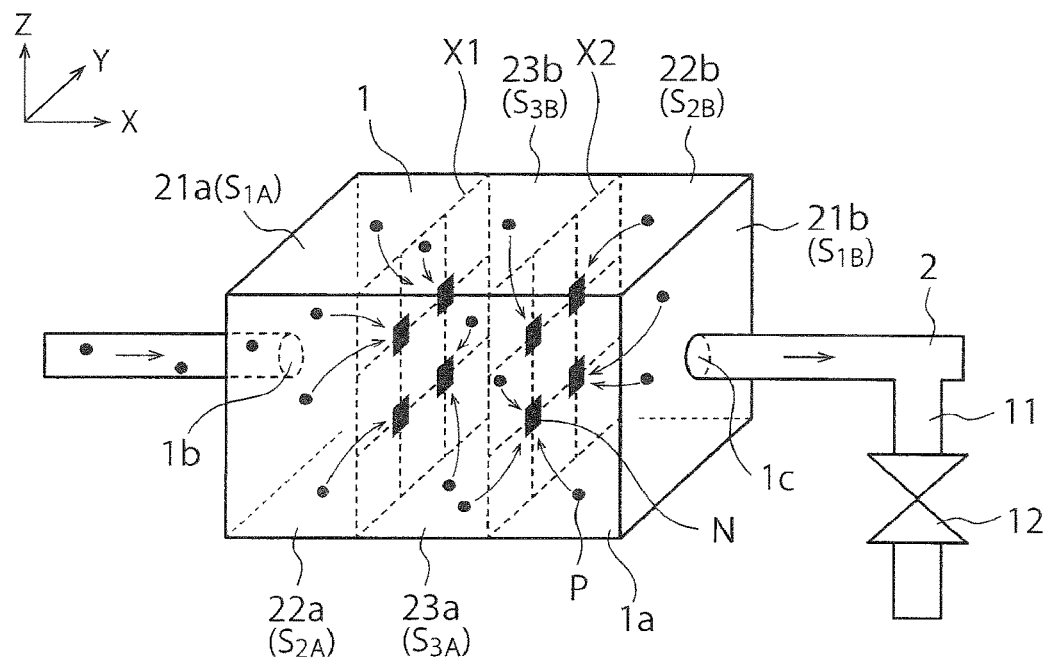
FIG. 4 is a perspective view showing operations of the dust collecting apparatus in the first embodiment.

FIG. 4 is a perspective view showing operations of the dust collecting apparatus 1 in the first embodiment.

In FIG. 4, the first sound source 21*a* generates the standing sound wave having the nodes X1 and X2, the second sound source 22*a* generates the standing sound wave having the nodes Y1 and Y2, and the third sound source 23*a* generates the standing sound wave having the nodes Z1 and Z2 (illustration of the nodes Y1, Y2, Z1 and Z2 is omitted).

The dust collecting apparatus 1 simultaneously generates sound waves from the sound sources 21*a*, 22*a* and 23*a*. As a result, the standing sound wave having the nodes X1 and X2, the standing sound wave having the nodes Y1 and Y2, and the standing sound wave having the nodes Z1 and Z2 are synthesized to generate a synthetic standing sound wave that has nodes N at the intersection points of the nodes X1, X2, Y1, Y2, Z1 and Z2. Each node N in FIG. 4 has a point shape that does not contact the wall faces $S_{1A}$, $S_{1B}$, $S_{2A}$, $S_{2B}$, $S_{3A}$ and $S_{3B}$ (however, each node N in FIG. 4 is drawn in a quadrangle for the sake of convenience to make the occurrence position of each node N easily visible). In FIG. 4, force heading for the nodes N of the synthetic standing sound wave acts on the particles P, and thereby the particles P are trapped in the vicinity of the nodes N of the synthetic standing sound wave.

As shown in FIG. 4, the dust collecting apparatus 1 makes it possible, by discharging the fluid while trapping the particles P in the vicinity of the nodes N, to discharge the fluid in which the particles P are reduced. In this case, the concentration of the particles P in the fluid discharged from the discharge port 1*c* becomes lower than the concentration of the particles P in the fluid introduced to the introduction port 1*b*. The fluid is supplied to the substrate processing apparatus 15 via the second channel 13.

Figure 5:
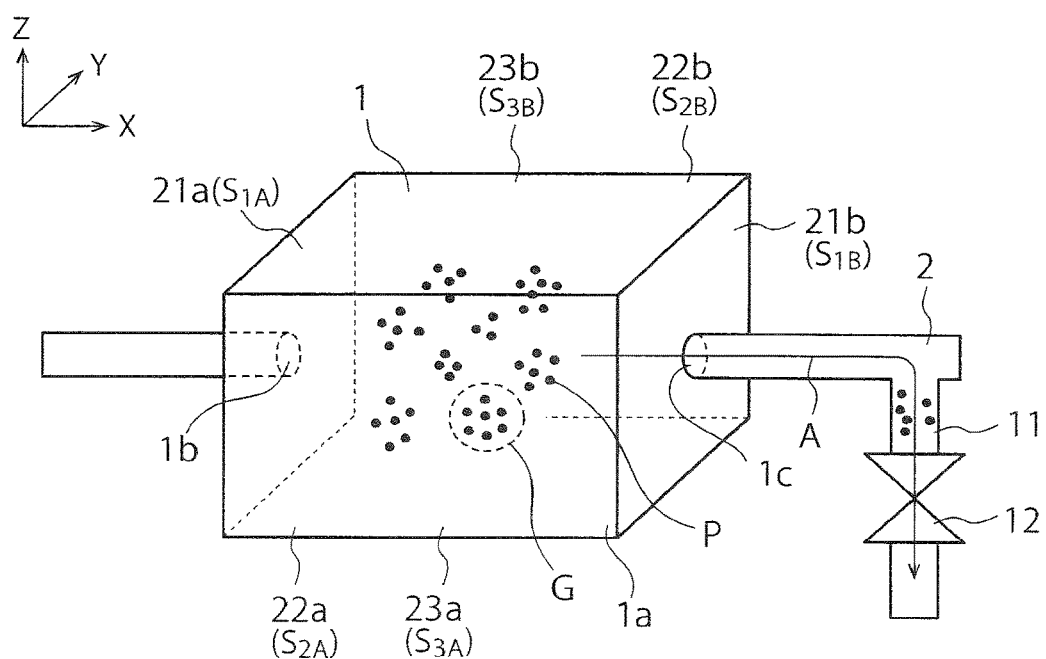
FIG. 5 is another perspective view showing the operations of the dust collecting apparatus in the first embodiment.

FIG. 5 is another perspective view showing the operations of the dust collecting apparatus 1 in the first embodiment.

FIG. 5 shows groups G of the particles P trapped in the vicinity of the respective nodes N. When the processing of the wafer W by the substrate processing apparatus 15 is finished, the dust collecting apparatus 1 stops the sound sources 21*a*, 22*a* and 23*a*, and discharges the fluid in the container 1*a*. The dust collecting apparatus 1 can thereby discharge the fluid together with the particles P trapped in the vicinity of each node N.

As shown in FIG. 5, the dust collecting apparatus 1 makes it possible, by discharging the fluid together with these particles P, to discharge the fluid in which the particles P are concentrated. In this case, the concentration of the particles P in the fluid discharged from the discharge port 1*c* becomes higher than the concentration of the particles P in the fluid introduced to the introduction port 1*b*. The fluid is discharged to the first channel 11 as indicated by the arrow A, and discarded without being supplied to the substrate processing apparatus 15.

Figure 6A:
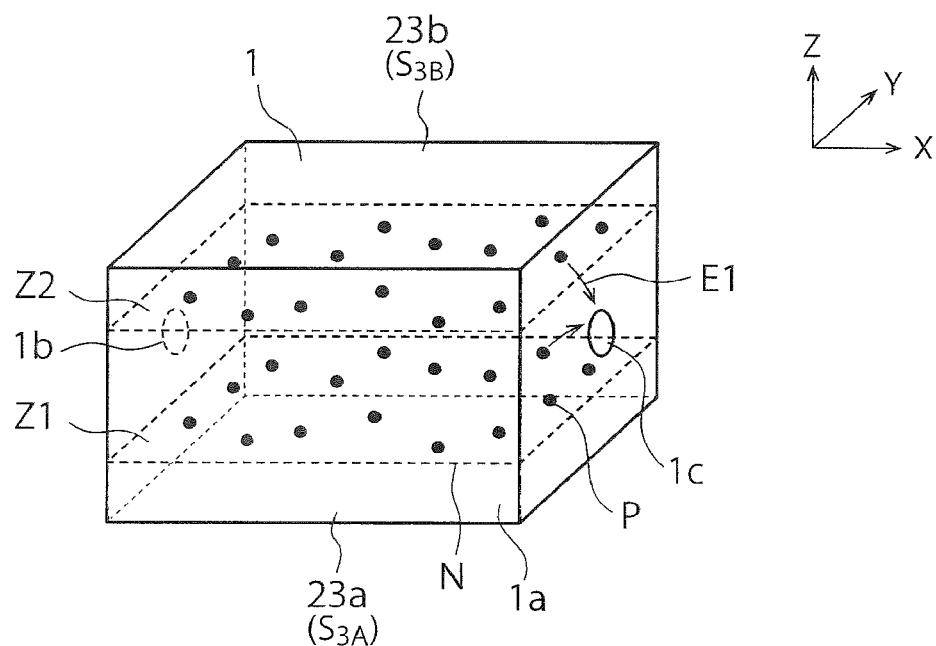
FIGS. 6A and 6B are perspective views showing operations of dust collecting apparatuses in comparative examples of the first embodiment.
Figure 6B:
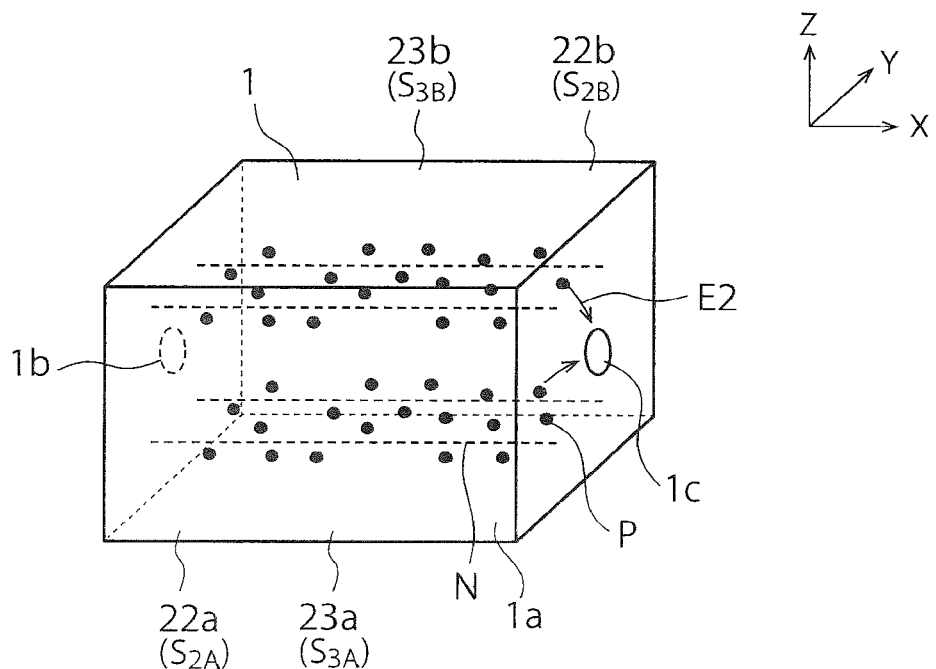

FIGS. 6A and 6B are perspective views showing operations of the dust collecting apparatus 1 in comparative examples of the first embodiment.

The dust collecting apparatus 1 of the comparative example in FIG. 6A includes only the third sound source 23*a* as a sound source. Therefore, each node N of this comparative example has a plane shape that contacts the wall faces $S_{1A}$, $S_{1B}$, $S_{2A}$, and $S_{2B}$. In other words, the shape of each node N in this comparative example is an open surface that has end portions on the wall faces $S_{1A}$, $S_{1B}$, $S_{2A}$ and $S_{2B}$.

The dust collecting apparatus 1 of the comparative example in FIG. 6B includes only the second and third sound sources 22*a* and 23*a* as sound sources. Therefore, each node N of this comparative example has a straight-line shape that contacts the wall faces $S_{1A}$ and $S_{1B}$. In other words, the shape of each node N in this comparative example is an open curve that has end portions on the wall faces $S_{1A}$ and $S_{1B}$.

In these comparative examples, there is a problem that the particles P that have been trapped in the vicinity of the nodes N leave the nodes N in the vicinity of the end portions of the nodes N. Furthermore, there is a problem that the particles P that have approached the nodes N in the vicinity of the end portions of the nodes N are not trapped but pass through the nodes N to leave the nodes N. In these cases, the particles P are not constrained by the nodes N but move. As a result, there occurs a problem that the particles P are discharged from the discharge port 1*c* (refer to arrows E1 and E2), and trapping efficiency of the particles P declines.

On the other hands, each node N of the present embodiment in FIG. 4 does not contact the wall faces $S_{1A}$, $S_{1B}$, $S_{2A}$, $S_{2B}$, $S_{3A}$ and $S_{3B}$, and therefore does not have the end portions on the wall faces $S_{1A}$, $S_{1B}$, $S_{2A}$, $S_{2B}$, $S_{3A}$ and $S_{3B}$. Accordingly, the present embodiment makes possible to avoid the problems regarding the leaving of the particles P caused by the end portions of each node N, and to improve the trapping efficiency of the particles P.

In this manner, the particles P in the fluid in the present embodiment are eliminated by using the sound waves. Therefore, the present embodiment makes it possible to eliminate the particles P in the fluid without using a filter, and to avoid problems related to the filter. For example, the present embodiment makes it possible to avoid the problems such as the clogging of the filter, the pressure loss of the fluid at the filter, and the costs and contamination for replacing the filter.

Figure 7A:
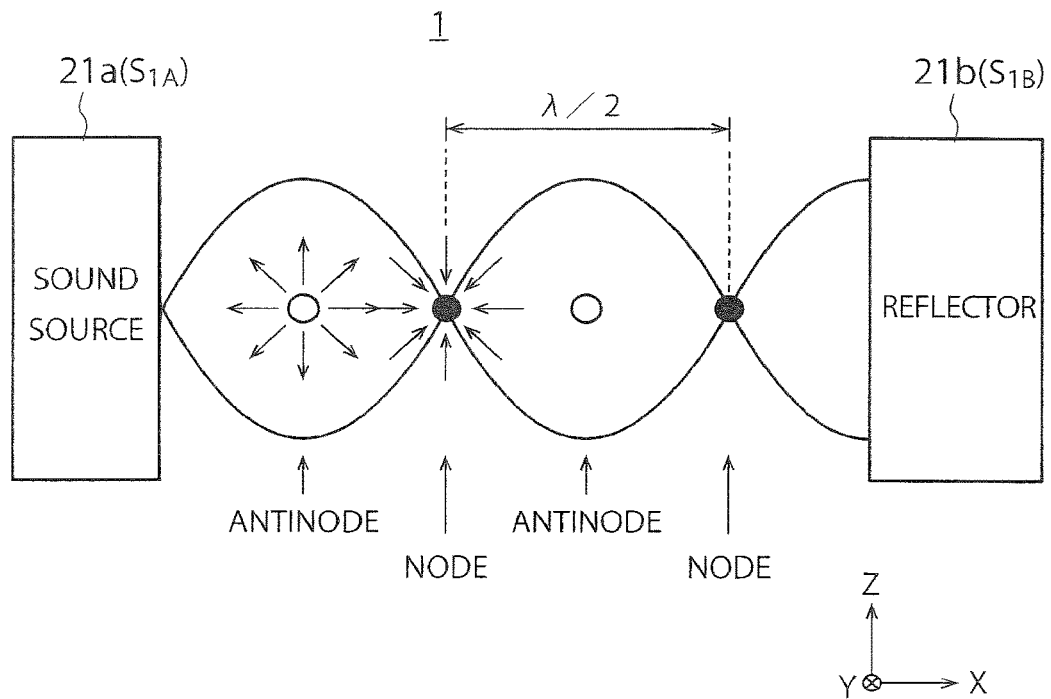
FIGS. 7A and 7B are diagrams for illustrating a standing sound wave in the dust collecting apparatus of the first embodiment.
Figure 7B:
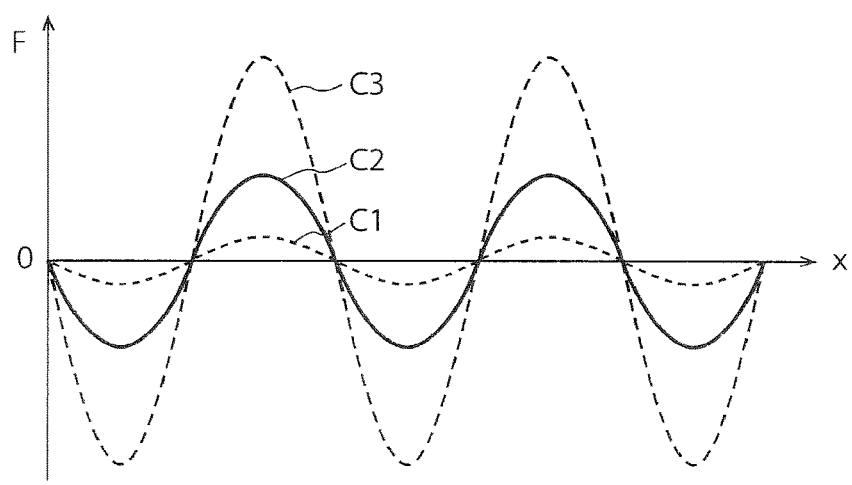

FIGS. 7A and 7B are diagrams for illustrating the standing sound wave in the dust collecting apparatus 1 of the first embodiment.

Similarly to FIG. 3A, FIG. 7A shows an example of the standing sound wave generated between the first sound source 21a and the first reflector 21b. The reference sign λ represents the wavelength of the standing sound wave. The force F acting on the particles P from the standing sound wave is given by the following Expression (1).

$$F = V[B+(1-\gamma)]kA^2/(\rho c)\cdot\sin(2kx) \quad (1)$$

Here, V represents the volume of a particle P, k represents the wavenumber of the sound wave, and A represents the amplitude of the sound wave. Moreover, B, γ, ρ and c are values representing properties of the fluid. Expression (1) represents the force F acting on the particle P positioned on the coordinate x.

FIG. 7B is a graph representing the force F acting on the particle P positioned on the coordinate x. The curves C1, C2 and C3 indicate the force F in the cases where the amplitude A of the standing sound wave is 10 μm, 15 μm and 20 μm, respectively. The peaks of the curves C1, C2 and C3 represent the force F acting on the particle P at the antinodes of the standing sound wave. As can be seen from Expression (1) and the curves C1, C2 and C3, the force F can be increased by increasing the wavenumber k or the amplitude A of the standing sound wave.

As described above, the sound sources 21a, 22a and 23a of the present embodiment generate the standing sound wave having the nodes N that do not contact the inner wall face of the container 1a, thereby trapping the particles P in the vicinity of the nodes N of the standing sound wave. Therefore, the present embodiment makes it possible to appropriately eliminate the particles P in the fluid such that the trapping efficiency of the particles P can be improved, the problems related to the filter can be avoided and the like.

Second Embodiment

Figure 8:
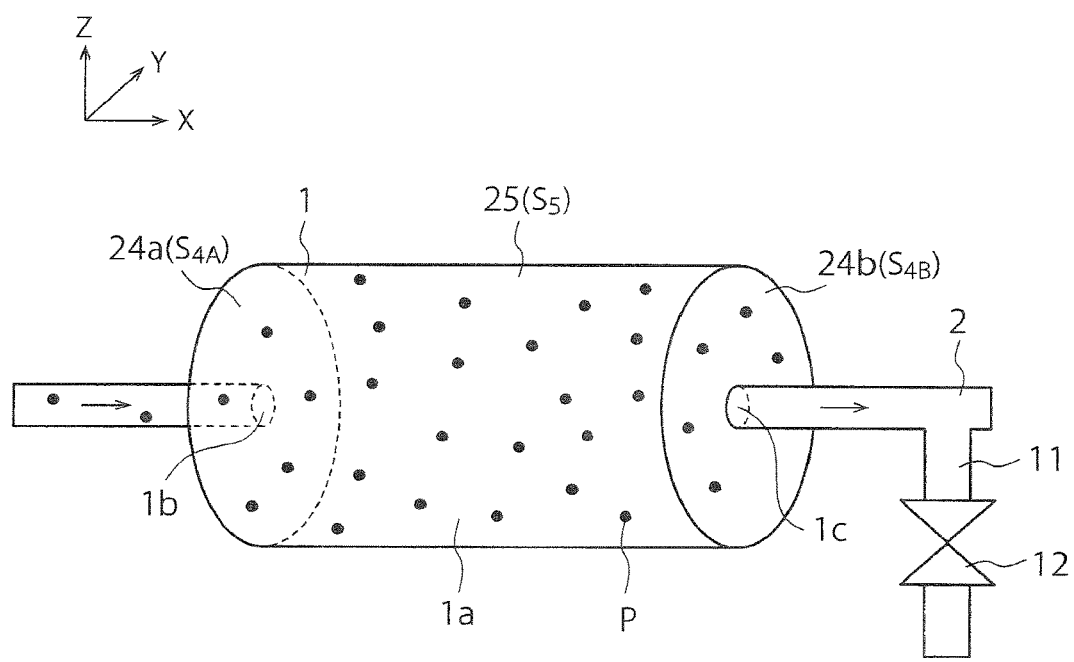
FIG. 8 is a perspective view showing a structure of a dust collecting apparatus in a second embodiment.

FIG. 8 is a perspective view showing a structure of the dust collecting apparatus 1 in a second embodiment.

The container 1a of the present embodiment includes an inner wall face having a shape of a cylindrical column. Specifically, the container 1a of the present embodiment includes a pair of first wall faces $S_{4A}$ and $S_{4B}$ that are perpendicular to the X-direction and are opposed to each other, and a second wall face $S_5$ having a cylindrical shape extending in the X-direction. The introduction port 1b is provided on one first wall face $S_{4A}$, and the discharge port 1c is provided on the other first wall face $S_{4B}$.

The dust collecting apparatus 1 includes a first sound source 24a provided in the vicinity of one first wall face $S_{4A}$, and a first reflector 24b that forms the other first wall face $S_{4B}$. The dust collecting apparatus 1 further includes a second sound source 25 provided in the vicinity of the second wall face $S_5$. The first and second sound sources 24a and 25 are an example of one or more sound sources.

The first and second sound sources 24a and 25 generate sound waves in the container 1a. The reflector 24b reflects the sound waves from the first and second sound sources 24a and 25. The dust collecting apparatus 1 can generate, in the container 1a, a standing sound wave including one or more nodes and one or more antinodes by these sound sources and reflector. As a result, the force heading for the nodes of the standing sound wave acts on the particles P, and thereby the particles P are trapped in the vicinity of the nodes of the standing sound wave.

The first reflector 24b may be replaced with a sound source. In other words, the dust collecting apparatus 1 may include a sound source in the vicinity of only one of the first wall faces $S_{4A}$ and $S_{4B}$, or may include sound sources in the vicinity of both of the first wall faces $S_{4A}$ and $S_{4B}$.

Figure 9A:
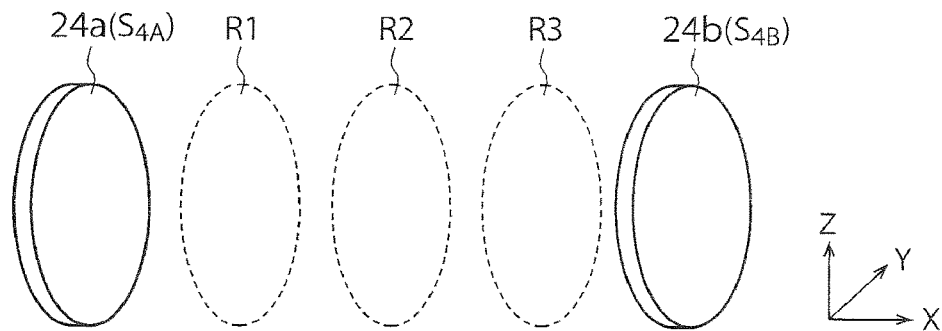
FIGS. 9A to 9C are perspective views for illustrating action of sound sources and a reflector of the second embodiment.
Figure 9B:
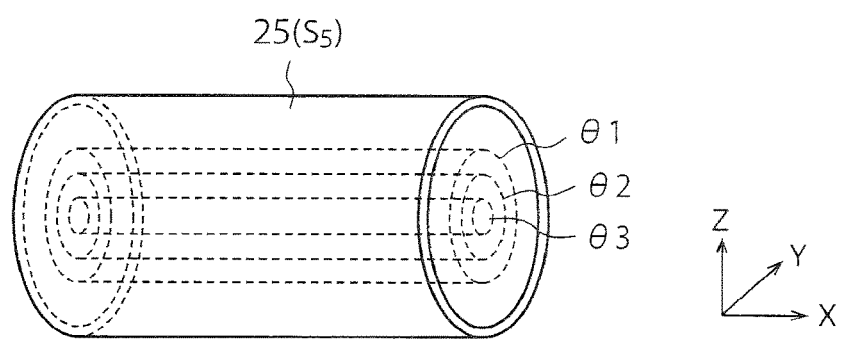
Figure 9C:
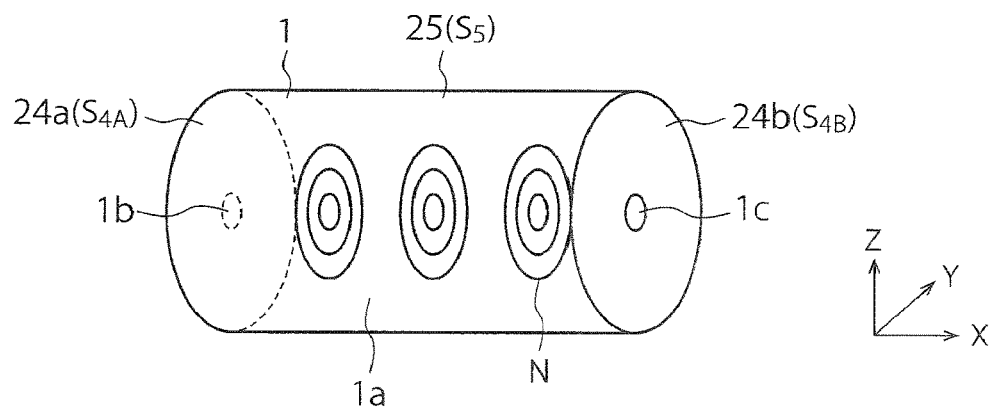

FIGS. 9A to 9C are perspective views for illustrating action of the sound sources and the reflector of the second embodiment.

FIG. 9A shows the action of the first sound source 24a and the first reflector 24b. The dust collecting apparatus 1 can generate a standing sound wave having nodes R1, R2 and R3 by generating a sound wave from the first sound source 24a and reflecting the sound wave by the first reflector 24b. The shapes of the nodes R1, R2 and R3 are planes perpendicular to the X-direction. The number of nodes in this standing sound wave may be other than three.

FIG. 9B shows the action of the second sound source 25. The dust collecting apparatus 1 can generate a standing sound wave having nodes θ1, θ2 and θ3 by generating a sound wave from the second sound source 25. The nodes θ1, θ2 and θ3 have cylindrical shapes extending in the X-direction. The number of nodes in this standing sound wave may be other than three.

In FIG. 9C, the first sound source 24a generates the standing sound wave having the nodes R1, R2 and R3, and the second sound source 25 generates the standing sound wave having the nodes θ1, θ2 and θ3 (illustration of these nodes is omitted).

The dust collecting apparatus 1 simultaneously generates sound waves from the first and second sound sources 24a and 25. As a result, the standing sound wave having the nodes R1, R2 and R3 and the standing sound wave having the nodes θ1, θ2 and θ3 are synthesized to generate a synthetic standing sound wave that has nodes N on the intersection lines of the nodes R1, R2, R3, θ1, θ2 and θ3. The shape of each node N in FIG. 9C is a closed curve (specifically, a circular ring) that does not contact the wall faces $S_{4A}$, $S_{4B}$ and $S_5$. In FIG. 9C, the force heading for the nodes N of the synthetic standing sound wave acts on the particles P, and thereby the particles P are trapped in the vicinity of the nodes N of the synthetic standing sound wave.

Each node N in FIG. 9C does not contact the wall faces $S_{4A}$, $S_{4B}$ and $S_5$, and does not have the end portions on the wall faces $S_{4A}$, $S_{4B}$ and $S_5$. Therefore, the present embodiment makes it possible, similarly to the first embodiment, to avoid the problems regarding the leaving of the particles P caused by the end portions of each node N, and to improve the trapping efficiency of the particles P. The shapes of the nodes N may be closed curves other than the circular rings.

Third Embodiment

Figure 10:
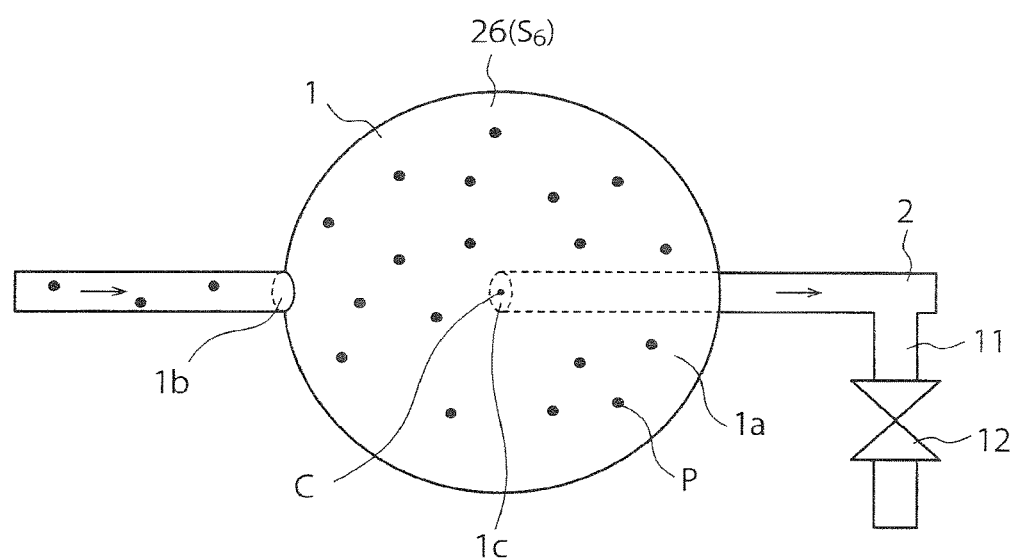
FIG. 10 is a perspective view showing a structure of a dust collecting apparatus in a third embodiment.

FIG. 10 is a perspective view showing a structure of the dust collecting apparatus 1 in a third embodiment.

The container 1a of the present embodiment includes a first wall face $S_6$ that is the inner wall face in a spherical shape. The dust collecting apparatus 1 includes a first sound source 26 provided in the vicinity of the first wall face $S_6$. The first sound source 26 is an example of one or more sound sources.

The dust collecting apparatus 1 can generate, in the container 1a, a standing sound wave including one or more nodes and one or more antinodes by the first sound source 26. As a result, the force heading for the nodes of the standing sound wave acts on the particles P, and thereby the particles P are trapped in the vicinity of the nodes of the standing sound wave.

A reference sign C indicates the center of the first wall face $S_6$ that has the spherical shape. In the present embodiment, it is desirable that the distance between the introduction port 1b and the center C is different from the distance between the discharge port 1c and the center C. In FIG. 10, this setting is realized by providing the introduction port 1*b* in the vicinity of the first wall face $S_6$ and providing the discharge port 1*c* in the vicinity of the center C. Details of this setting will be described with reference to FIGS. 11A and 11B.

Figure 11A:
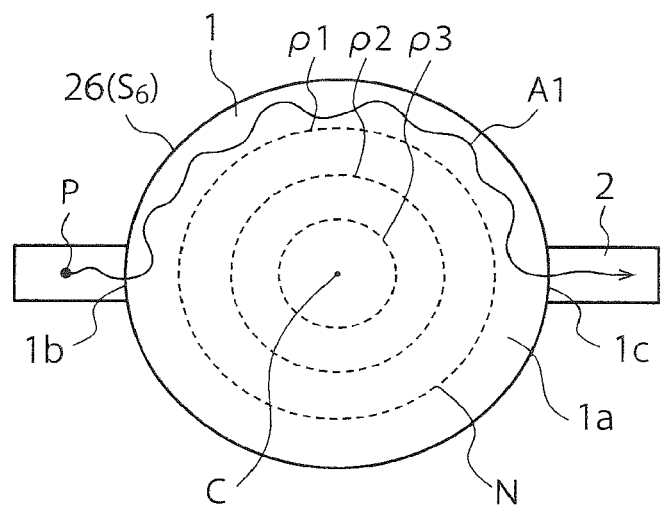
FIGS. 11A and 11B are cross-sectional views showing operations of the dust collecting apparatus in the third embodiment.
Figure 11B:
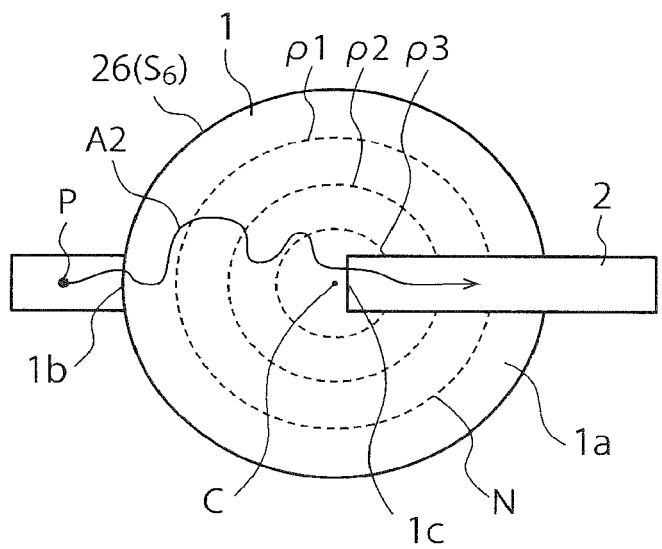

FIGS. 11A and 11B are cross-sectional views showing operations of the dust collecting apparatus 1 in the third embodiment.

FIG. 11A shows the dust collecting apparatus 1 in which the distance between the introduction port 1*b* and the center C is the same as the distance between the discharge port 1*c* and the center C. This dust collecting apparatus 1 can generate a standing sound wave that includes, as one or more nodes N, the nodes ρ1, ρ2 and ρ3 having spherical shapes. The number of nodes N in this standing sound wave may be other than three.

The shape of each node N in FIG. 11A is a closed surface (specifically, a spherical surface) that does not contact the first wall face $S_6$. In FIG. 11A, the force heading for the nodes N of the standing sound wave acts on the particles P, and thereby the particles P are trapped in the vicinity of the nodes N of the standing sound wave.

Each node N in FIG. 11A does not contact the first wall face $S_6$, and does not have the end portions on the first wall face $S_6$. Therefore, the present embodiment makes it possible, similarly to the first and second embodiments, to avoid the problems regarding the leaving of the particles P caused by the end portions of each node N, and to improve the trapping efficiency of the particles P. The shapes of the nodes N may be closed surfaces other than the spherical surfaces.

In FIG. 11A, a particle P from the introduction port 1*b* can, however, reach the discharge port 1*c* without passing through the respective nodes N (refer to the arrow A1). The reason is that the distance between the introduction port 1*b* and the center C is the same as the distance between the discharge port 1*c* and the center C. In this case, there is a possibility that the particles P are not trapped in the vicinity of the nodes N.

FIG. 11B shows the dust collecting apparatus 1 in which the distance between the introduction port 1*b* and the center C is different from the distance between the discharge port 1*c* and the center C. This dust collecting apparatus 1 can generate a standing sound wave that includes, as one or more nodes N, the nodes ρ1, ρ2 and ρ3 having spherical shapes. The number of nodes N in this standing sound wave may be other than three.

In FIG. 11B, each particle P from the introduction port 1*b* must pass through at least one node N to reach the discharge port 1*c* (refer to the arrow A2). The reason is that the distance between the introduction port 1*b* and the center C is different from the distance between the discharge port 1*c* and the center C. This makes it possible to reduce the possibility that the particles P are not trapped as shown in FIG. 11A.

The discharge port 1*c* in FIG. 11B may be provided between the center C and the first wall face $S_6$, not in the vicinity of the center C. In this case, the particles P from the introduction port 1*b* can reach the discharge port 1*c* by passing through the nodes N located in the vicinity of the first wall face $S_6$ and without passing through the nodes N located in the vicinity of the center C. These particles P have high possibility of being trapped by the nodes N located in the vicinity of the first wall face $S_6$.

Fourth Embodiment

Figure 12:
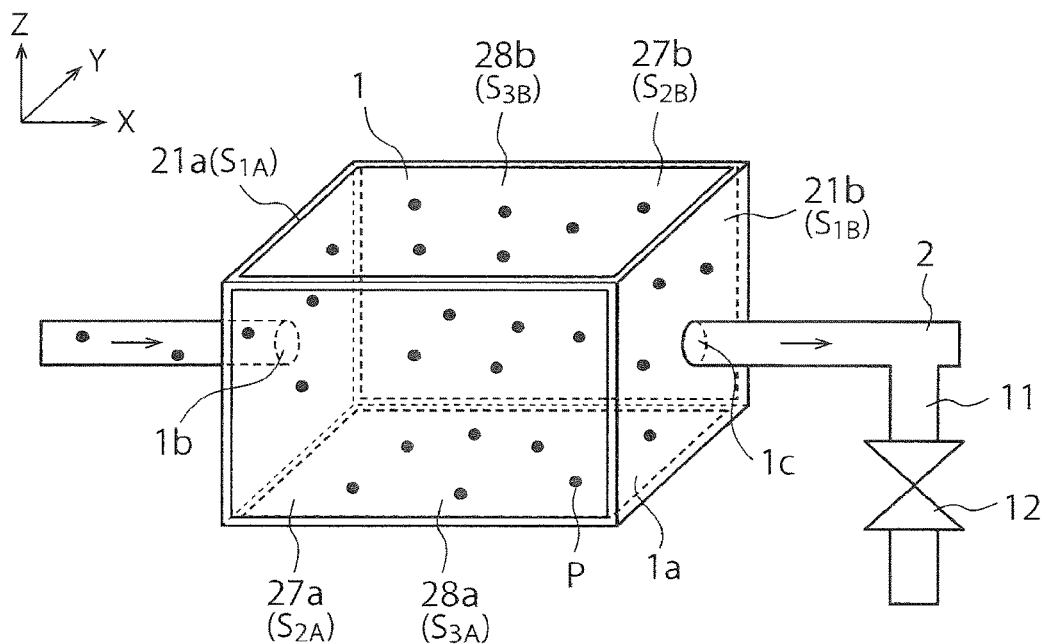
FIG. 12 is a perspective view showing a structure of a dust collecting apparatus in a fourth embodiment.

FIG. 12 is a perspective view showing a structure of the dust collecting apparatus 1 in a fourth embodiment.

The container 1*a* of the present embodiment includes an inner wall face having a shape of a rectangular parallelepiped. Specifically, the container 1*a* of the present embodiment has a pair of first wall faces $S_{1A}$ and $S_{1B}$ that are perpendicular to the X-direction and are opposed to each other, a pair of second wall faces $S_{2A}$ and $S_{2B}$ that are perpendicular to the Y-direction and are opposed to each other, and a pair of third wall faces $S_{3A}$ and $S_{3B}$ that are perpendicular to the Z-direction and are opposed to each other. The introduction port 1*b* is provided on one first wall face $S_{1A}$, and the discharge port 1*c* is provided on the other first wall face $S_{1B}$. This is similar to the first embodiment.

The dust collecting apparatus 1 includes a first sound source 21*a* provided in the vicinity of one first wall face $S_{1A}$, and a first reflector 21*b* that forms the other first wall face $S_{1B}$. The first sound source 21*a* is an example of one or more sound sources.

The dust collecting apparatus 1 further includes wall materials 27*a* and 27*b* that form the second wall faces $S_{2A}$ and $S_{2B}$, and wall materials 28*a* and 28*b* that form the third wall faces $S_{3A}$ and $S_{3B}$. The second and third wall faces $S_{2A}$, $S_{2B}$, $S_{3A}$ and $S_{3B}$ are examples of a predetermined portion on a wall face of a container.

Figure 13:
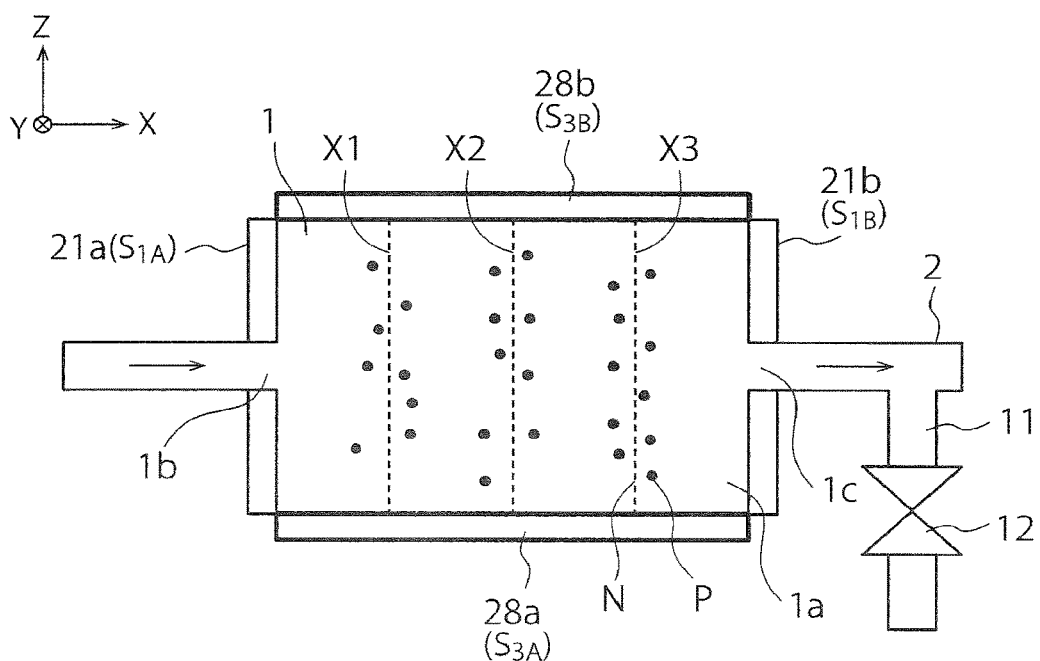
FIG. 13 is a cross-sectional view for illustrating action of a sound source, a reflector and wall materials of the fourth embodiment.

FIG. 13 is a cross-sectional view for illustrating action of the sound source, the reflector and the wall materials of the fourth embodiment.

The dust collecting apparatus 1 of the present embodiment can generate a standing sound wave having nodes X1, X2 and X3 as one or more nodes N. As a result, the force heading for these nodes N acts on the particles P, and thereby the particles P are trapped in the vicinity of these nodes N.

The dust collecting apparatus 1 of the present embodiment includes only the first sound source 21*a* as a sound source. Therefore, each node N of the present embodiment has a plane shape that contacts the wall faces $S_{2A}$, $S_{2B}$, $S_{3A}$ and $S_{3B}$. In other words, the shape of each node N in the present embodiment is an open surface that has end portions on the wall faces $S_{2A}$, $S_{2B}$, $S_{3A}$ and $S_{3B}$. This is similar to the case of the comparative example in FIG. 6A.

In the comparative example in FIG. 6A, there is the problem that the particles P that have been trapped in the vicinity of the nodes N leave the nodes N in the vicinity of the end portions of the nodes N. Furthermore, there is the problem that the particles P that have approached the nodes N in the vicinity of the end portions of the nodes N are not trapped but pass through the nodes N to leave the nodes N. In these cases, the particles P are not constrained by the nodes N but move. As a result, there occurs the problem that the particles P are discharged from the discharge port 1*c*, and the trapping efficiency of the particles P declines.

Therefore, the wall faces $S_{2A}$, $S_{2B}$, $S_{3A}$ and $S_{3B}$ of the present embodiment are formed of the wall materials 27*a*, 27*b*, 28*a* and 28*b* that can prevent the particles P from leaving from the nodes N located in the vicinity of the wall faces $S_{2A}$, $S_{2B}$, $S_{3A}$ and $S_{3B}$. Examples of such wall materials 27*a*, 27*b*, 28*a* and 28*b* include a wall material having properties such that a sealing property for the particles P is excellent, the particles P are less likely to move in the vicinity of the wall faces and the like. According to the present embodiment, since the end portions of each node N contacts the wall materials 27*a*, 27*b*, 28*a* and 28*b*, it is possible to avoid the problems regarding the leaving of the particles P caused by the end portions of each node N, and to improve the trapping efficiency of the particles P.

The wall materials 27*a*, 27*b*, 28*a* and 28*b* may be replaced with other members (jigs) that can prevent the particles P from leaving from the nodes N located in the vicinity of the wall faces $S_{2A}$, $S_{2B}$, $S_{3A}$ and $S_{3B}$. Examples of such members include protective films and coating films.

The dust collecting apparatus 1 of the present embodiment may include only the first and second sound sources 21a and 22a as sound sources. Each node N in this case has a straight-line shape that contacts the wall faces $S_{3A}$ and $S_{3B}$. In other words, the shape of each node N in this case is an open curve that has end portions on the wall faces $S_{3A}$ and $S_{3B}$. This is similar to the case of the comparative example in FIG. 6B. In this case, the wall faces $S_{3A}$ and $S_{3B}$ of the present embodiment are formed of the wall materials 28a and 28b that can prevent the particles P from leaving from the nodes N located in the vicinity of the wall faces $S_{3A}$ and $S_{3B}$.

Fifth Embodiment

Figure 14:
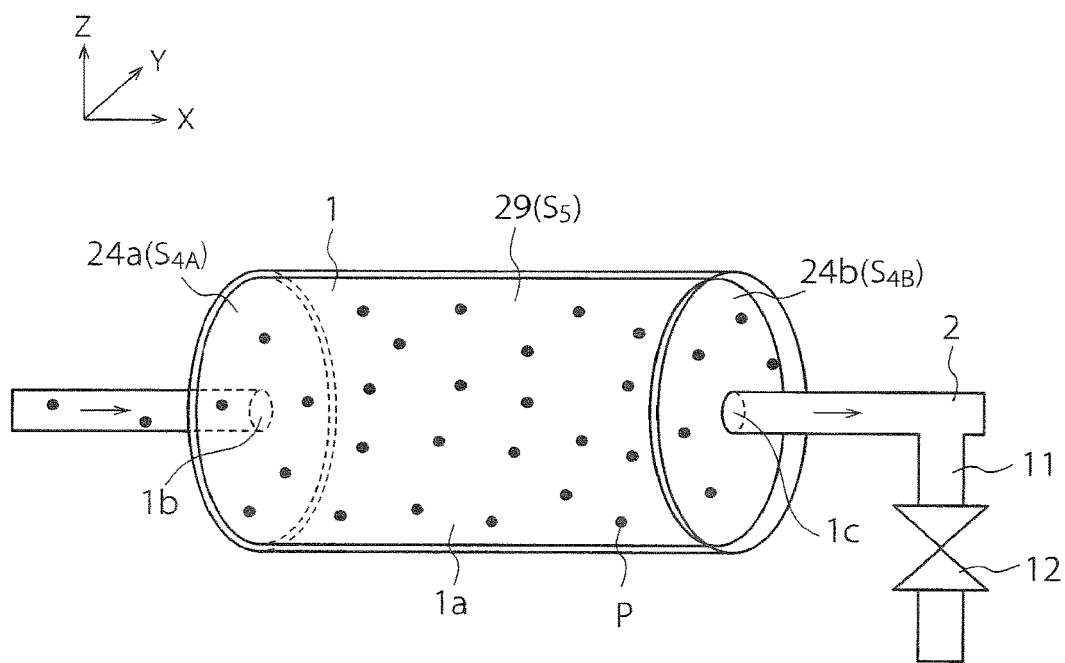
FIG. 14 is a perspective view showing a structure of a dust collecting apparatus in a fifth embodiment.

FIG. 14 is a perspective view showing a structure of the dust collecting apparatus 1 in a fifth embodiment.

The container 1a of the present embodiment includes an inner wall face having a shape of a cylindrical column. Specifically, the container 1a of the present embodiment has a pair of first wall faces $S_{4A}$ and $S_{4B}$ that are perpendicular to the X-direction and are opposed to each other, and a second wall face $S_5$ having a cylindrical shape extending in the X-direction. The introduction port 1b is provided on one first wall face $S_{4A}$, and the discharge port 1c is provided on the other first wall face $S_{4B}$. This is similar to the second embodiment.

The dust collecting apparatus 1 includes a first sound source 24a provided in the vicinity of one first wall face $S_{4A}$, and a first reflector 24b that forms the other first wall face $S_{4B}$. The first sound source 24a is an example of one or more sound sources.

The dust collecting apparatus 1 further includes a wall material 29 that forms the second wall face $S_5$. The second wall face $S_5$ is an example of the predetermined portion on the wall face of the container.

The dust collecting apparatus 1 of the present embodiment includes only the first sound source 24a as a sound source. Therefore, similarly to the nodes R1, R2 and R3 in FIG. 9A, each node N of the present embodiment has a plane shape that contacts the wall face $S_5$ (not shown). In other words, the shape of each node N in the present embodiment is an open surface that has an end portion on the wall face $S_5$. Therefore, for the reason similar to the case of the fourth embodiment, the wall face $S_5$ of the present embodiment is formed of the wall material 29 that can prevent the particles P from leaving from the nodes N located in the vicinity of the wall face $S_5$. This makes it possible to improve the trapping efficiency of the particles P.

In FIG. 11B of the third embodiment, since the discharge port 1c is positioned in the vicinity of the center C, a portion of the circulating channel 2 is positioned in the container 1a. Therefore, the nodes N contact an outer circumferential face of the circulating channel 2. Consequently, the outer circumferential face of the circulating channel 2 in the container 1a may be formed of the wall material that is proposed in the fourth and fifth embodiments.

Sixth Embodiment

Figure 15A:
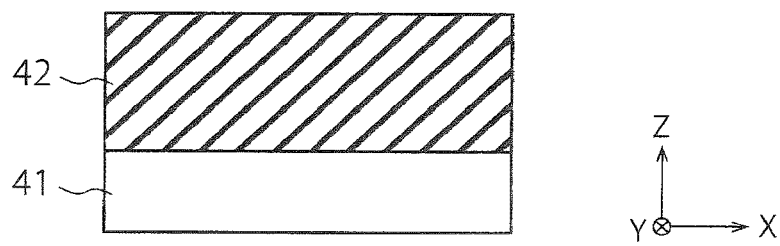
FIGS. 15A to 15C are cross-sectional views showing a method of manufacturing a semiconductor device in a sixth embodiment.
Figure 15B:
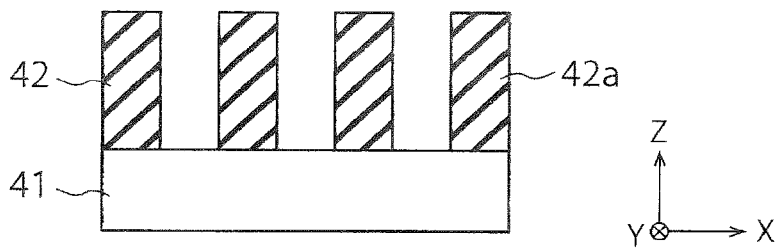
Figure 15C:
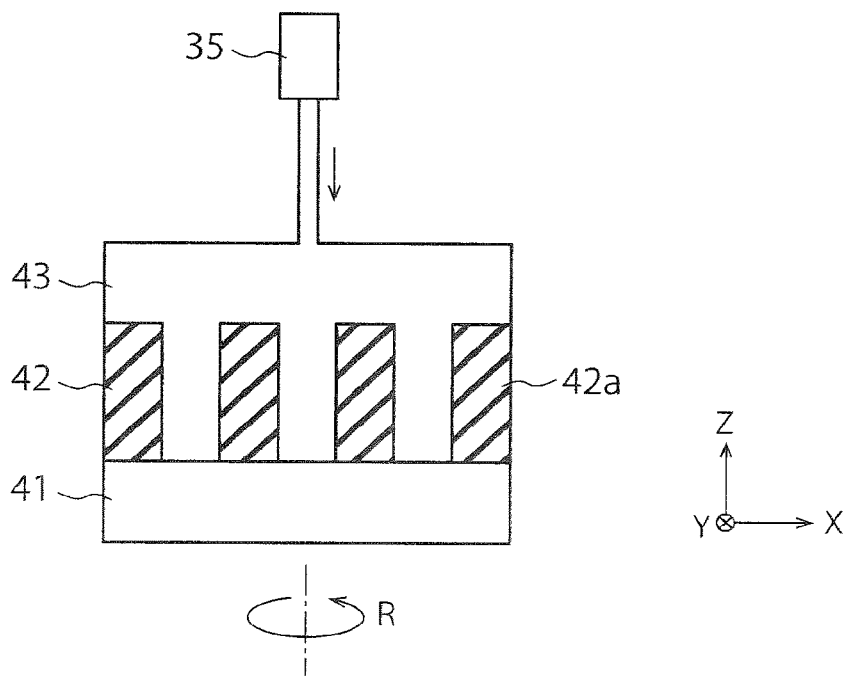

FIGS. 15A to 15C are cross-sectional views showing a method of manufacturing a semiconductor device in a sixth embodiment.

FIG. 15A shows the wafer W of FIG. 1. The wafer W includes a semiconductor substrate 41 and a workpiece layer 42 formed on the semiconductor substrate 41. The workpiece layer 42 may be formed directly on the semiconductor substrate 41, or may be formed on the semiconductor substrate 41 via another layer. The workpiece layer 42 is an insulator in FIG. 15A, but may be a conductor layer or a semiconductor layer.

In the present embodiment, after the workpiece layer 42 is formed on the semiconductor substrate 41, the workpiece layer 42 is processed by etching (FIG. 15B). As a result, the workpiece layer 42 is processed into plural convex portions 42a. Examples of the convex portions 42a include interconnect patterns or hard mask patterns for forming the interconnect patterns.

The wafer W is then fed into the substrate processing apparatus 15. The substrate processing apparatus 15 ejects a substrate processing liquid 43 to the wafer W from the nozzle 35 while rotating the wafer W as the arrow R (FIG. 15C). Examples of the substrate processing liquid 43 include the fluid from the dust collecting apparatus 1, for example, the cleaning liquid or the rinse liquid. In the present embodiment, it is possible to clean the wafer W with the cleaning liquid, and to rinse the wafer W with the rinse liquid.

Thereafter, processing of the wafer W is continued in the present embodiment. In this manner, the semiconductor device is manufactured from the wafer W.

While certain embodiments have been described, these embodiments have been presented by way of example only, and are not intended to limit the scope of the inventions. Indeed, the novel apparatuses, systems and methods described herein may be embodied in a variety of other forms; furthermore, various omissions, substitutions and changes in the form of the apparatuses, systems and methods and described herein may be made without departing from the spirit of the inventions. The accompanying claims and their equivalents are intended to cover such forms or modifications as would fall within the scope and spirit of the inventions.

The invention claimed is:

1. A dust collecting apparatus comprising:
a container configured to contain a fluid that includes particles to be collected; and
one or more sound sources configured to generate, in the container, a standing sound wave including at least one node to trap the particles in a vicinity of the node,
wherein
the one or more sound sources are configured to generate the standing sound wave so that the node does not contact a wall face of the container or contacts a predetermined portion of the wall face of the container,
the predetermined portion is formed of a wall material, protective film or coating film that prevents the particles from leaving from the node located in a vicinity of the predetermined portion, and
a shape of the node is a point, a closed curve, a closed surface, an open curve that includes an end portion on the predetermined portion, or an open surface that includes an end portion on the predetermined portion.

2. The apparatus of claim 1, wherein the container comprises an introduction port configured to introduce the fluid into the container, and a discharge port configured to discharge, from the container, the fluid in which the particles are concentrated or reduced by the trapping.

3. The apparatus of claim 1, wherein
the container comprises a pair of opposed first wall faces, a pair of opposed second wall faces, and a pair of opposed third wall faces, and the sound sources include at least one first sound source provided in a vicinity of the first wall faces, at least one second sound source provided in a vicinity of the second wall faces, and at least one third sound source provided in a vicinity of the third wall faces.

4. The apparatus of claim 3, wherein at least any one among one of the pair of first wall faces, one of the pair of second wall faces, and one of the pair of third wall faces is formed as a reflector that reflects a sound wave from the sound sources.

5. The apparatus of claim 3, wherein at least any one of the first, second and third sound sources is provided in a vicinity of both of the pair of first wall faces, both of the pair of second wall faces, or both of the pair of third wall faces.

6. The apparatus of claim 1, wherein
the container comprises a pair of opposed first wall faces, and a second wall face having a cylindrical shape, and
the sound sources include at least one first sound source provided in a vicinity of the first wall faces, and at least one second sound source provided in a vicinity of the second wall face.

7. The apparatus of claim 6, wherein one of the pair of first wall faces is formed as a reflector that reflects a sound wave from the sound sources.

8. The apparatus of claim 6, wherein the at least one first sound source is provided in a vicinity of both of the pair of first wall faces.

9. The apparatus of claim 1, wherein
the container comprises a first wall face having a spherical shape, and
the sound sources include at least one first sound source provided in a vicinity of the first wall face.

10. The apparatus of claim 9, wherein
the container comprises an introduction port configured to introduce the fluid into the container, and a discharge port configured to discharge the fluid from the container, and
a distance between the introduction port and a center of the spherical shape is different from a distance between the discharge port and the center of the spherical shape.

11. The apparatus of claim 9, wherein
the container comprises an introduction port configured to introduce the fluid into the container, and a discharge port configured to discharges the fluid from the container, and
the introduction port and the discharge port are provided at positions such that the particles from the introduction port are unable to reach the discharge port without passing through the node.

12. The apparatus of claim 1, wherein
the container comprises a pair of opposed first wall faces, a pair of opposed second wall faces, and a pair of opposed third wall faces,
the sound sources are provided in a vicinity of one pair or two pairs of wall faces among the pair of first wall faces, the pair of second wall faces and the pair of third wall faces, and
the predetermined portion is provided on remaining one pair or two pairs of wall faces among the pair of first wall faces, the pair of second wall faces and the pair of third wall faces.

13. The apparatus of claim 12, wherein
the container comprises an introduction port configured to introduce the fluid into the container, and a discharge port configured to discharge the fluid from the container,
the introduction port and the discharge port are provided on the first wall faces, and
the predetermined portion is provided on the second or third wall faces.

14. The apparatus of claim 1, wherein
the container comprises a pair of opposed first wall faces, and a second wall face having a cylindrical shape,
the sound sources are provided in a vicinity of the first wall faces, and
the predetermined portion is provided in a vicinity of the second wall face.

15. A substrate processing system comprising:
a container configured to contain a fluid that includes particles to be collected;
one or more sound sources configured to generate, in the container, a standing sound wave including at least one node to trap the particles in a vicinity of the node; and
a substrate processing apparatus configured to process a substrate with the fluid discharged from the container, wherein
the one or more sound sources are configured to generate the standing sound wave so that the node does not contact a wall face of the container or contacts a predetermined portion of the wall face of the container,
the predetermined portion is formed of a wall material, protective film or coating film that prevents the particles from leaving from the node located in a vicinity of the predetermined portion, and
a shape of the node is a point, a closed curve, a closed surface, an open curve that includes an end portion on the predetermined portion, or an open surface that includes an end portion on the predetermined portion.

16. The system of claim 15, wherein
the container is configured to discharge, to a first channel, the fluid in which the particles are concentrated by the trapping and to discharge, to a second channel, the fluid in which the particles are reduced by the trapping, and
the substrate processing apparatus is configured to process the substrate with the fluid from the second channel.

17. The system of claim 15, wherein the substrate processing apparatus is configured to clean or rinse the substrate with the fluid.

* * * * *